United States Patent [19]

Yoo

[11] Patent Number: 5,812,442
[45] Date of Patent: Sep. 22, 1998

[54] FERROELECTRIC MEMORY USING LEAKAGE CURRENT AND MULTI-NUMERATION SYSTEM FERROELECTRIC MEMORY

[75] Inventor: In-Kyeong Yoo, Suwon, Rep. of Korea

[73] Assignee: Samsung Electronics Co., Ltd., Suwon, Rep. of Korea

[21] Appl. No.: 851,891

[22] Filed: May 6, 1997

[30] Foreign Application Priority Data

May 6, 1996 [KR] Rep. of Korea ............. 96-14707

[51] Int. Cl.⁶ .................................. G11C 11/22
[52] U.S. Cl. ................ 365/145; 365/117; 257/295; 257/310
[58] Field of Search .................. 365/145, 157, 365/117; 257/295, 310

[56] References Cited

U.S. PATENT DOCUMENTS

| | | | |
|---|---|---|---|
| 5,164,808 | 11/1992 | Evens, Jr. et al. | 361/305 |
| 5,206,829 | 4/1993 | Thakoor et al. | 365/117 |
| 5,361,224 | 11/1994 | Takasu | 365/145 |
| 5,373,462 | 12/1994 | Achard et al. | 365/145 |
| 5,508,953 | 4/1996 | Fukuda et al. | 365/145 |
| 5,512,773 | 4/1996 | Wolf et al. | 257/471 |
| 5,519,234 | 5/1996 | Paz De Araujo et al. | 257/295 |
| 5,541,422 | 6/1996 | Wolf et al. | 257/9 |
| 5,615,144 | 3/1997 | Kimura et al. | 365/145 |

*Primary Examiner*—David C. Nelms
*Assistant Examiner*—Hien Nguyen
*Attorney, Agent, or Firm*—Foley & Lardner

[57] ABSTRACT

A non-volatile ferroelectric memory using a leakage current of a dielectric and a multi-numeration system ferroelectric memory are provided. Unit cells are formed of a transistor. A dielectric or a ferroelectric is used as a gate insulating material. A ferroelectric capacitor is deposited on the upper portion of the gate insulating material and the upper electrode of a ferroelectric capacitor is used as a gate. "Writing" is performed by selecting a material in which the leakage current of the ferroelectric has a negligible value and the leakage current of the dielectric (used as the gate insulating material) is sharply increased. Charges induced between the drain and the source, are increased by applying the voltages which have various levels and identical pulse widths (in the case of "deleting" voltages, having identical levels and various pulse widths) making the leakage current of a various current densities flow through the gate insulating material. Thus, the multi-numeration system information can be stored.

11 Claims, 13 Drawing Sheets

$V_o = V_w + V_b$

"ON"
"WRITING"
"CHARGING"
"0"

$V_d = V_e + V_b$

"OFF"
"DELETING"
"DISCHARGING"
"1"

FIG. 19(B)
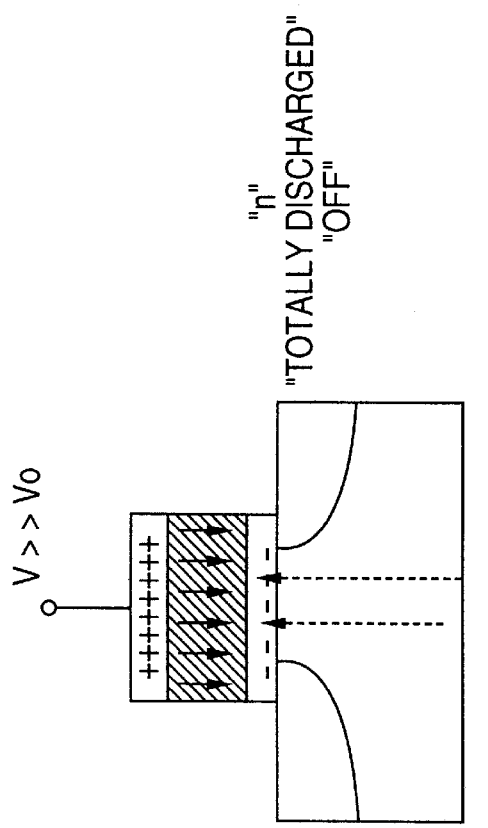
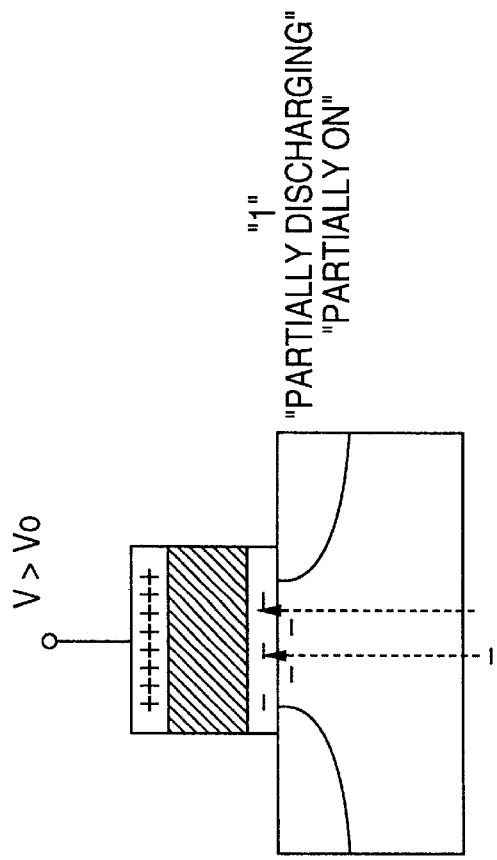

FERROELECTRIC MEMORY USING LEAKAGE CURRENT AND MULTI-NUMERATION SYSTEM FERROELECTRIC MEMORY

BACKGROUND OF THE INVENTION

The present invention relates to a ferroelectric memory which becomes nonvolatile using the leakage current of a dielectric and multiple memory states of ferroelectrics which can realize the multi-numeration system using the leakage current.

A random access memory cell is generally constituted by a field effect transistor (FET) and a linear capacitor. Data is stored by a charge accumulation caused by a polarization of the dielectric existing between two electrodes in the linear capacitor. However, since the charge accumulated by physical characteristics of the dielectric existing between the linear capacitor is automatically discharged, the random access memory cannot operate as a memory unless the cells are periodically recharged and refreshed. Also, when power is interrupted, the charge in the capacitor is discharged and data is lost. Thus, the memory using the linear capacitor is volatile.

A memory using a ferroelectric capacitor in which the ferroelectric is used as a dielectric material, is provided in order to prevent the data from being lost. Generally, the ferroelectric capacitor is a medium in which information can be stored without refreshing, since the charges accumulated by the polarization are not easily discharged due to the physical characteristics of the ferroelectric. Methods for reading information stored in the memory by ferroelectric polarization are divided into two methods, one of which is a destructive read out (DRO) method and the other is a non-destructive read out (NDRO) method. In the DRO method, stored information is read by applying a uniform signal to the ferroelectric capacitor, switching a polarization state, and sensing a generated signal. In the NDRO method, a polarization is switched during storing of information and is not switched during reproducing (reading). Since the polarization state of the ferroelectric gradually weakens and causes fatigue due to the polarization state being repeatedly switched (in order to record/reproduce the information on/from the ferroelectric capacitor), the NDRO method is advantageous to extending the life of the memory device. The design of the 1T-1C FRAM, produced by Ramtron, is representative of the DRO method. The design of the SFRAM, produced by Radiant Technologies, or metal-ferroelectric-metal-insulator-Si (MFMIS) produced by Rohm, is representative of the NDRO method. However, the above methods cannot completely solve the fatigue phenomenon of the ferroelectric since polarization switching is necessarily performed when "writing" the information on the memory devices.

Also, a four terminal transistor produced by Shibata, a neuron MOSFET and the MFS FET using partial switching produced by Ishiwara, are known as memories which can realize the multi-numeration system, namely, memories on which information of a multiplex state can be recorded. The operation principles of the four terminal transistor and the neuron MOSFET will be described with reference to FIGS. 1 through 5.

For example, while a diode (not shown) is a 2-terminal device, the FET shown in FIG. 1(A) is a 3-terminal device and the FET shown in FIG. 2(A) is a 4-terminal device. Here, the 3-terminal device and the 4-terminal device each include a source S and a drain D. While the 3-terminal device each includes a gate G, the 4-terminal device includes two gates $G_1$ and $G_2$. The characteristics of their operations are as follows.

The characteristic curve of a drain current $I_D$ is shown in FIG. 1(B) (and occurs between the source S and the drain D in the 3-terminal device of FIG. 1(A) according to a gate voltage $V_G$ when a uniform drain voltage $V_{DS}$ is applied between the sources and drain D). As shown in FIG. 1(B), the 3-terminal device has a single characteristic curve.

The characteristic curves of a drain current $I_D$ are shown in FIG. 2(B) (and occur between the source S and the drain D in the 4-terminal device of FIG. 2(B) according to gate voltages $V_{G1}$ and $V_{G2}$ when a uniform drain voltage $V_{DS}$ is applied between the source S and drain D). As shown in FIG. 2(B), the 4-terminal device has a plurality of characteristic curves as the gate voltage increases.

The characteristics of the drain current $I_D$ will be described in detail with reference to FIGS. 3 through 4. As shown in FIGS. 3(A) and 3(B), the drain current $I_D$ increases as the gate voltage $V_G$ increases in a saturation region of $V_{DS}$ (the region to the right of the dotted line) in the 3-terminal device. The characteristic curve of the drain current $I_D$ is three dimensional in the 4-terminal device. As shown in FIGS. 4(A) and 4(B), the drain current $I_D$ increases as the first gate voltage $V_{G1}$ increases in the saturation region of $V_{DS}$ (the region to the right of the dotted plane). The amount of increase becomes larger as the second gate voltage $V_{G2}$ increases.

The neuron MOSFET (hereinafter, υMOS) shown in FIG. 5 is developed as a multi terminal device by applying the drain current characteristic of the 4-terminal device. The υMOS forms a floating gate by n multi gates. When separate signal voltages are applied to the n multi gates, the υMOS having a threshold voltage $V_{TH}$ is turned on with the following condition.

$$\phi_F = (C_1 V_1 + C_2 V_2 + \ldots + C_n V_n)/C_{TOT} > V_{TH}$$

In the above equation, $C_1, C_2, \ldots, C_n$ denote capacitances of the respective gates and denotes a total of the capacitances.

The 4-terminal transistor of Shibata or the υMOS is volatile even though the multi-information can he recorded using the above characteristics. The MFS FET of Isawara is non-volatile since the ferroelectric is used. However, the fatigue phenomenon of the ferroelectric is serious and the material of forming the ferroelectric used in the memory is restricted to the material which can be directly deposited on silicon Si.

SUMMARY OF THE INVENTION

It is an object of the present invention to provide a ferroelectric memory, using the leakage current of a dielectric, in which it is possible to record multi information without generating a fatigue phenomenon.

To achieve the above object, there is provided a ferroelectric memory, comprising a plurality of unit cells, each having a conductive substrate, a source and a drain doped with impurities leaving a conductive channel of a uniform width on the substrate, a dielectric layer deposited so as to cover the edge of the source and the drain and the conductive channel, a lower electrode deposited on the dielectric layer, a ferroelectric layer deposited on the lower electrode, and an upper electrode deposited on the ferroelectric layer, wherein the leakage currents of the dielectric layer and the ferroelectric layer have negligible values at less than a predetermined voltage, and the leakage current of the ferroelectric layer is negligible and the leakage current of the dielectric is more than a predetermined value at more than the predetermined voltage.

The dielectric layer is preferably formed of a high dielectric or another ferroelectric which is either different from or same as the ferroelectric in the ferroelectric layer.

Also, the dielectric layer is formed of a dielectric material in which the leakage current is generated by a Schottky emission or a Frankel-Poole emission or Fowler-Nordein tunneling.

The dielectric layer is formed of a buffer layer having the leakage current value.

Another object of the present invention is to provide a multi-numeration system ferroelectric memory using a leakage current.

To achieve the above object, there is provided a multi-numeration system ferroelectric memory, comprising a plurality of unit cells each having a conductive substrate, a source and a drain doped with impurities leaving a conductive channel of a uniform width on the substrate, a dielectric layer deposited so as to cover the edges of the source and the drain and the conductive channel, a lower electrode deposited on the dielectric layer, a ferroelectric layer deposited on the lower electrode, and an upper electrode deposited on the ferroelectric layer, and a power source for applying a predetermined voltage by which the leakage current of the dielectric layer and the ferroelectric layer has a negligible value to the upper electrode and n different deleting voltage levels to the upper electrode so as to classify the leakage currents of the dielectric from each other, in which the leakage current of the ferroelectric is negligible.

The n deleting voltage levels are preferably obtained by combining the voltages having different levels and an identical applying period to the voltages having an identical level and different applying periods.

Also, the substrate is preferably floated.

BRIEF DESCRIPTION OF THE DRAWINGS

The above objects and advantages of the present invention will become more apparent by describing in detail a preferred embodiment thereof with reference to the attached drawings in which.

FIGS. 19A and 19B show a sectional view of a multi-numeration system memory cell according to the present invention.

DETAILED DESCRIPTION OF THE PREFERRED EMBODIMENTS

Figure 1A:
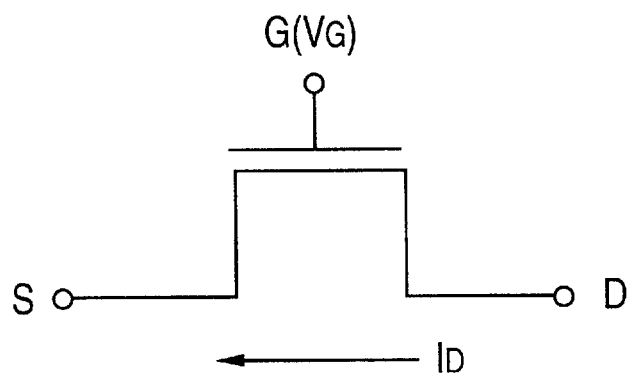
FIG. 1(A) and 1(B) show a conventional 3-terminal transistor and the drain current characteristic curve according to a gate voltage thereof.
Figure 1B:
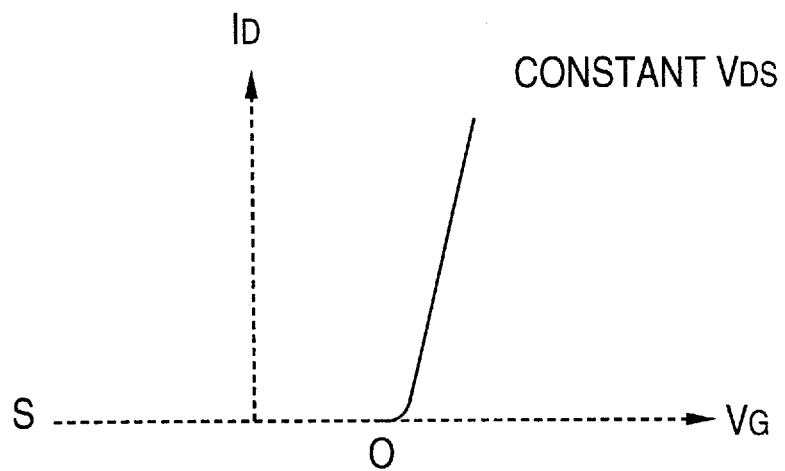
Figure 2A:
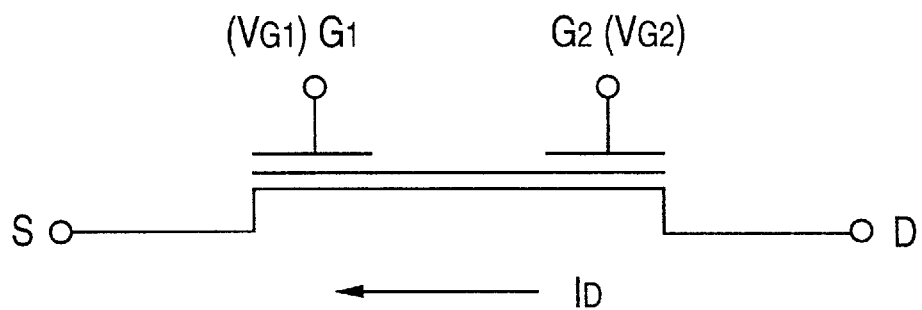
FIG. 2(A) and 2(B) show a conventional 4-terminal transistor and the drain current characteristic curves according to a gate voltage thereof.
Figure 2B:
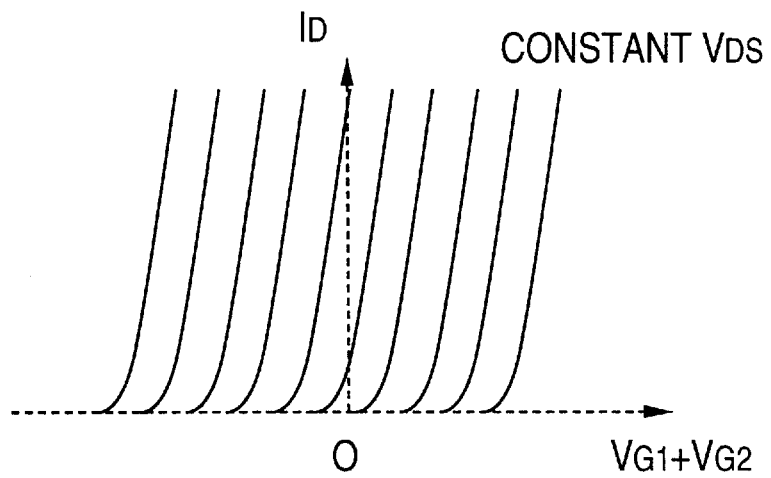
Figure 3A:
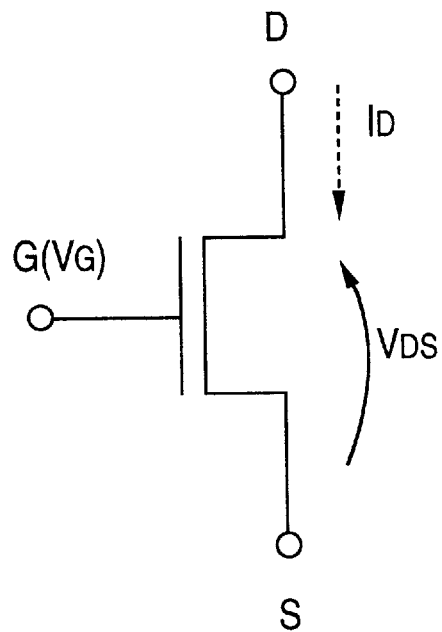
FIGS. 3(A), 3(B), 4(A) and 4(B) show conventional 3-terminal and 4-terminal transistors and respective drain current characteristic curves according to a gate voltages thereof.
Figure 3B:
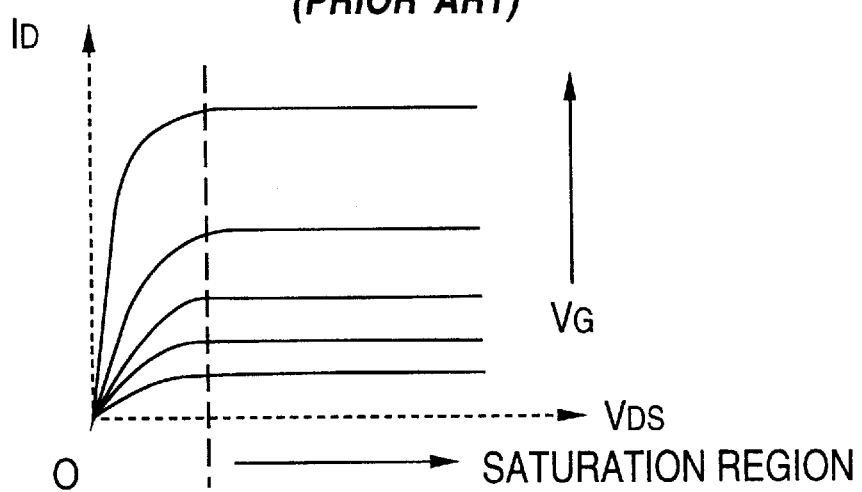
Figure 4A:
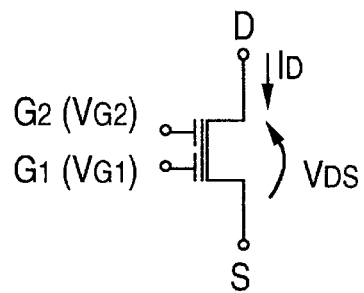
Figure 4B:
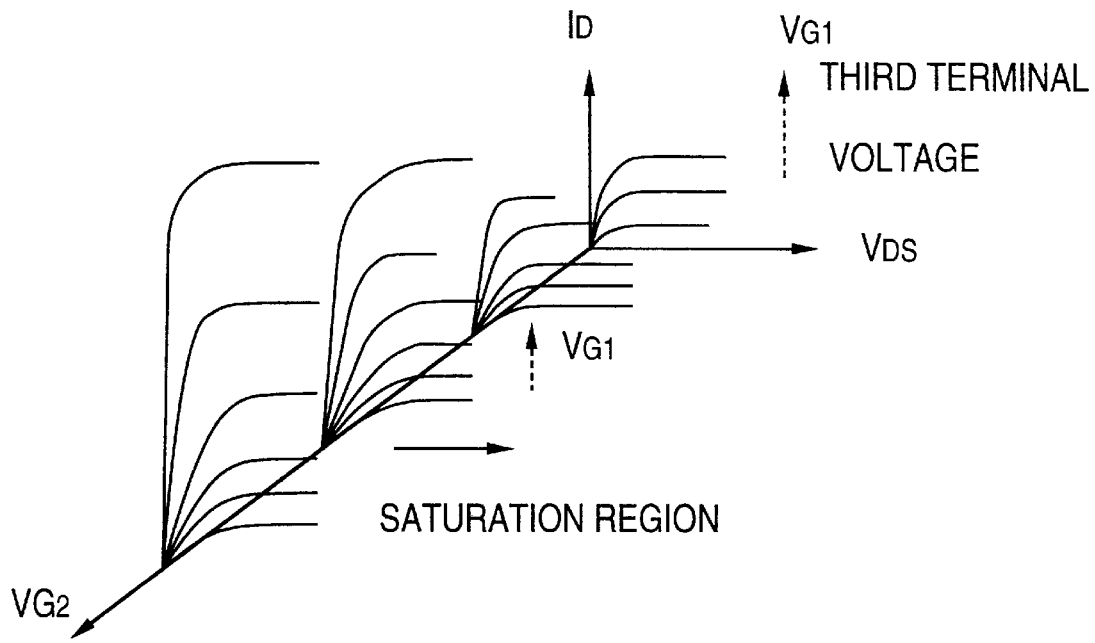
Figure 5:
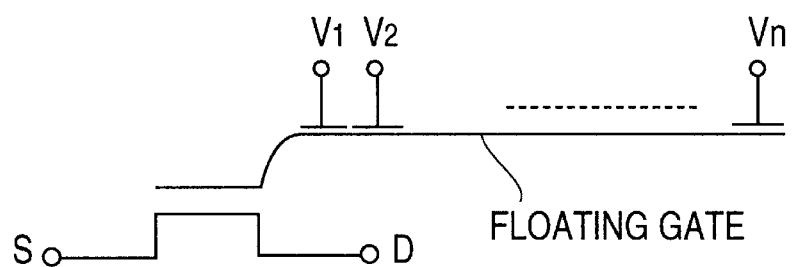
FIG. 5 shows a conventional neuron MOS transistor.
Figure 6:
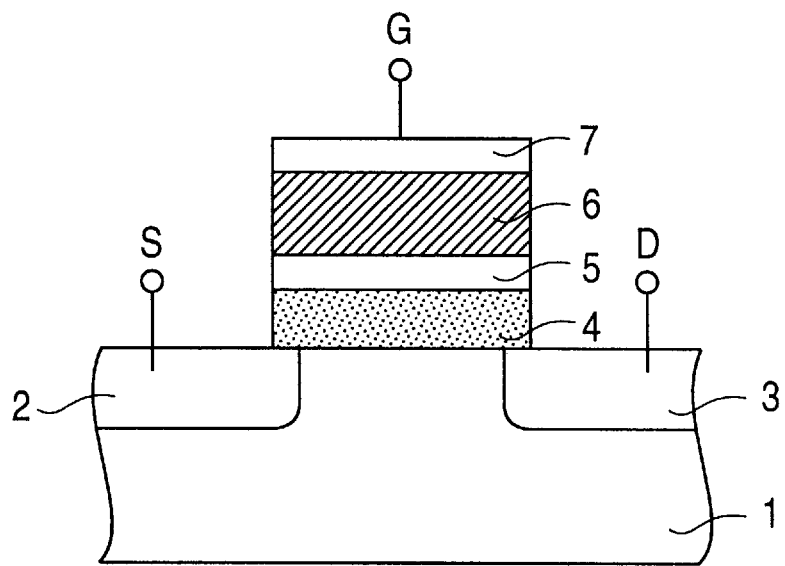
FIG. 6 is a sectional view of a ferroelectric memory cell according to the present invention.

Referring to FIG. 6, the unit cells of the ferroelectric memory, using a leakage current according to the present invention, are comprised of an FET and two capacitors formed in the upper portion of the FET. Namely, the FET has a source 2 and a drain 3 formed on a substrate 1 and two capacitors formed as a gate. The two capacitors are formed by sequentially depositing a dielectric layer 4, a lower electrode 5, a ferroelectric layer 6 and an upper electrode 7 so as to cover a channel between the source 2 and the drain 3. Here, the dielectric on which the ferroelectric capacitor is mounted is used instead of a gate insulating material of the transistor. The upper electrode 7 actually operates as the gate. The ferroelectric may be directly used as a material for forming a dielectric layer 4, because a polarization switching is not required for the memory of the present invention.

Figure 7:
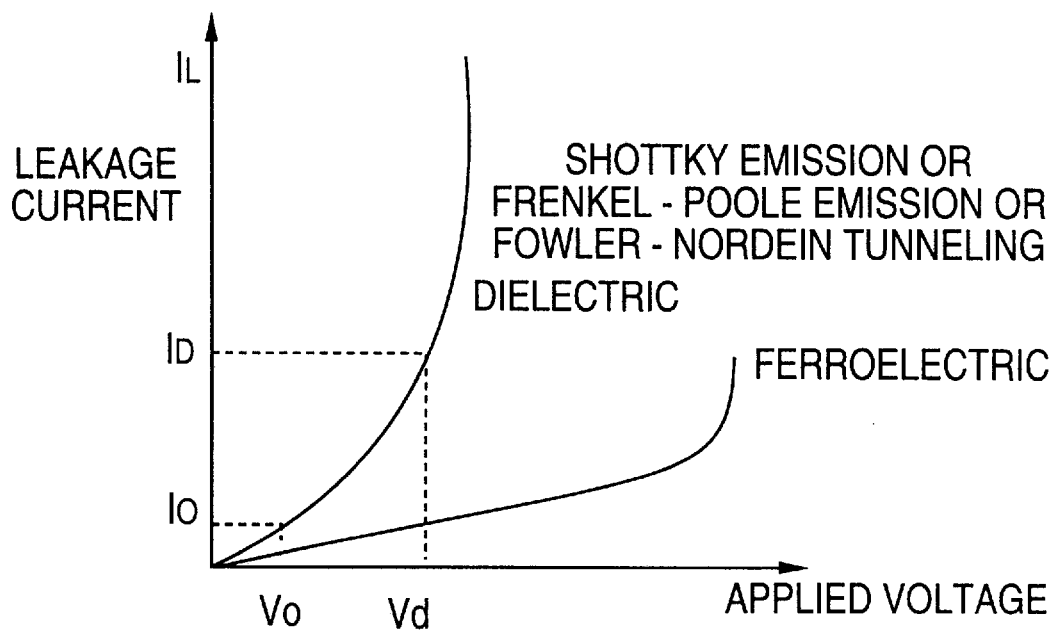
FIG. 7 shows a leakage current characteristic curve of a dielectric and a ferroelectric forming the ferroelectric memory cell shown in FIG. 6.

Also, the dielectric layer 4 and the ferroelectric layer 6 are respectively formed of materials having the leakage current characteristic shown in FIG. 7. Namely, the ferroelectric has a low leakage current $I_L$ (near to $I_o$) in a "writing" voltage Vo or a "deleting" voltage $V_d$ and the dielectric has a low leakage current $I_o$, in the "writing" voltage $V_o$ and has a high leakage current $I_d$ in the "deleting" voltage $V_d$. Therefore, the current flows through the dielectric during "deleting", thus forming a bound charge in the lower electrode 5 (shown in FIG. 6) of the ferroelectric capacitor. The dielectric or the ferroelectric can be used as the layer 4. The dielectric layer 4 is made of material which allows the bounded charges of the channel to be reducible using the principle of the Schottky emission or Frankel-Poole emission or Fowler-Nordein tunneling in the leakage current characteristic as shown in FIG. 7. $PbTiO_3$, $SrTiO_3$, $Pb(Zr,Ti)O_3$, $BaTiO_3$, $KTaO_3$, $KNbO_3$, $(Pb,La)TiO_3$, $PbZrO_3$, and $(Pb,La) ZrO_3$ can be used as the dielectric or ferroelectric material which is actually used as a gate oxide. It is possible to reduce the bound charges of the channel using a current caused by a high electric field such as space charge limited current.

During "writing" the transistor is turned "on" even with a low gate voltage since the bound charges are formed in the channels according to the above characteristics of the leakage current. During "deleting" a larger gate voltage is required to turn "on" the transistor since some bound charges of the channel become extinct and the bound charges are formed in the lower electrode of the ferroelectric capacitor. As a result, the transistor of the memory cell is turned "off" even though the voltage is applied to the gate in a "deleting" state.

Figure 8:
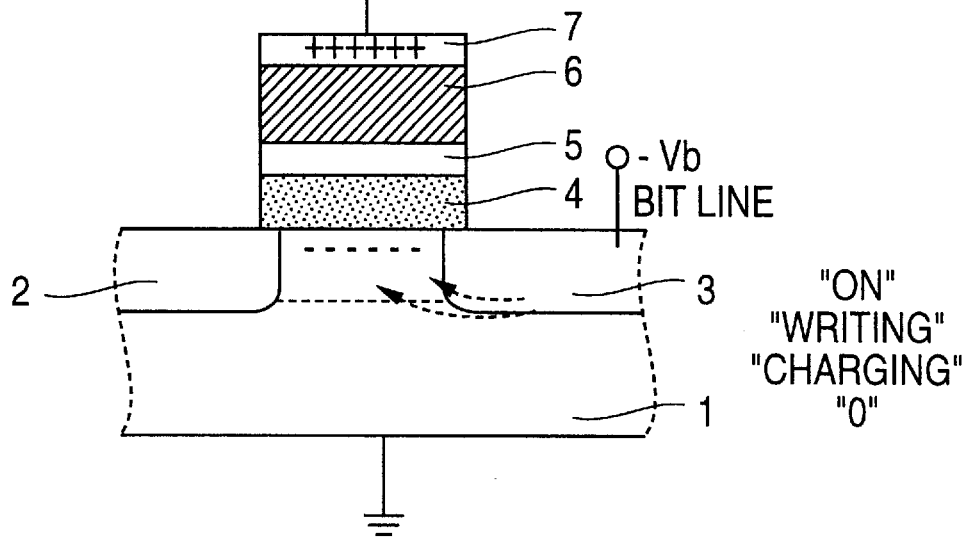
FIGS. 8 and 9 are for explaining the operation according to the leakage current characteristic corresponding to an application voltage of the ferroelectric memory cell shown in FIG. 6.
Figure 9:
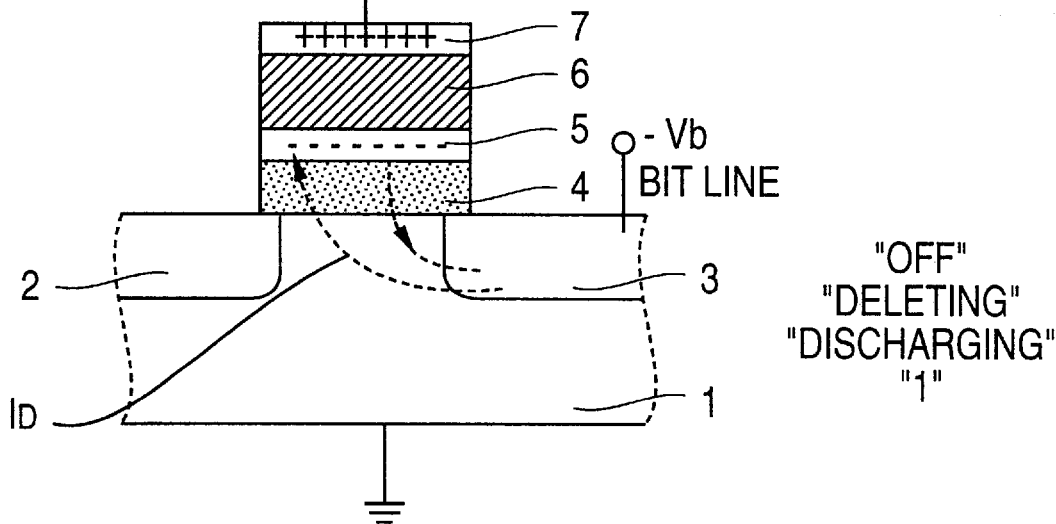

FIGS. 8 and 9 show the states in which the memory cell is respectively turned "on" and "off". When the substrate 1 of the transistor is grounded, a "writing" voltage Vo between a word line (the gate) and a bit line in the "writing" state becomes Vw−(−)Vb=Vw+Vb, as shown in FIG. 8. Here, Vw and Vb respectively denote the voltage of the word line and the voltage of the bit line. The voltage differences $V_d$ between the word line and the bit line in the "deleting" state becomes Ve−(−)Vb=Ve+Vb, as shown in FIG. 9. Here, Ve denotes the voltage of the word line and the voltage Vb applied to the bit line has a negative value.

Figure 11:
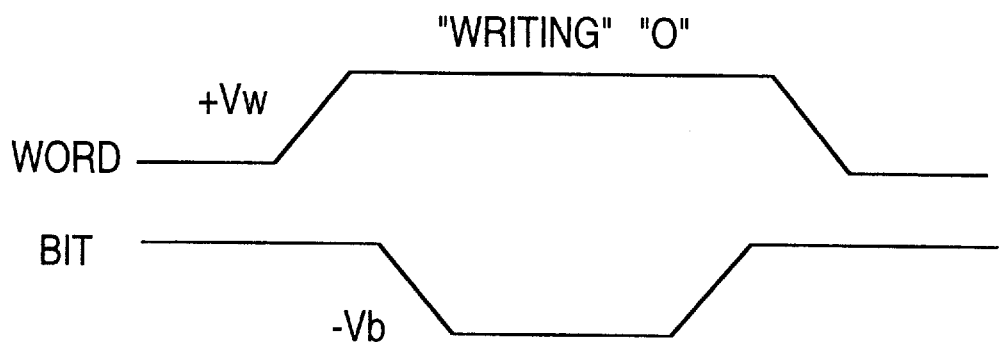
FIGS. 11 and 12 show input signal waveforms during recording and reading in the ferroelectric memory cell shown in FIG. 6.

The bound charges are charged (the leakage current is ignored) in the conductive channel of the FET (as shown in FIG. 8) when the "writing" voltages shown in FIG. 11 are applied to the word line and the bit line during "writing". The bound charges are formed in lower electrode 5 of the ferroelectric capacitor since the bound charges of the conductive channel are moved to the upper portion of the dielectric 4 by the leakage current $I_D$ of the dielectric as shown in FIG. 9 when the "deleting" voltages (shown in FIG. 13) are applied to the world line and the bit line during "deleting". Therefore, the performance of the conductive channel is weakened and the FET is turned "off". When positive voltage of Vb is applied to the bit line, Vo and Vd should be high so that their difference may maintain the above mentioned voltage difference.

Figure 10:
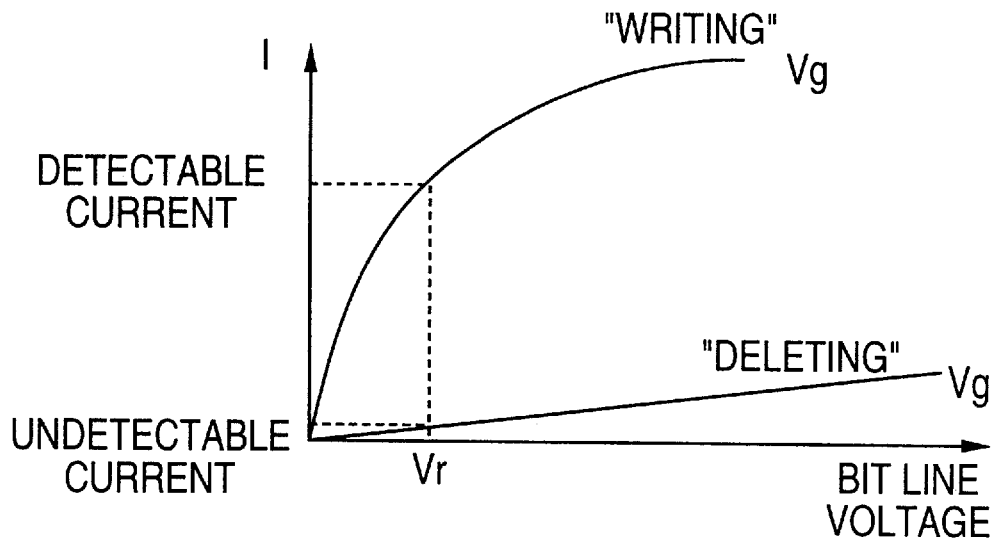
FIG. 10 shows a characteristic I–V curve during reading of the ferroelectric memory cell shown in FIG. 6.
Figure 12:
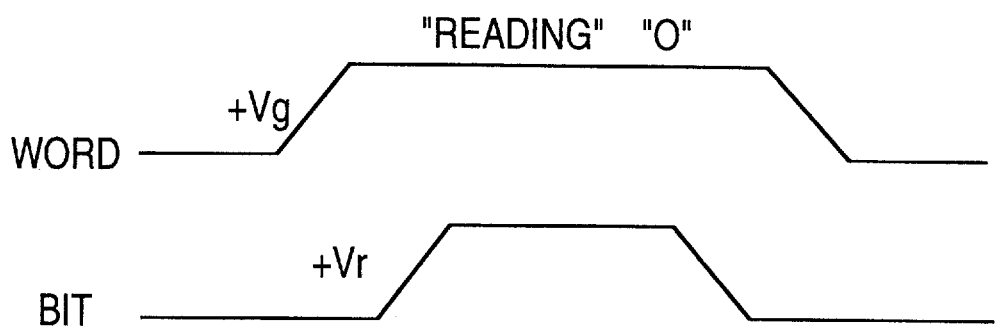
Figure 14:
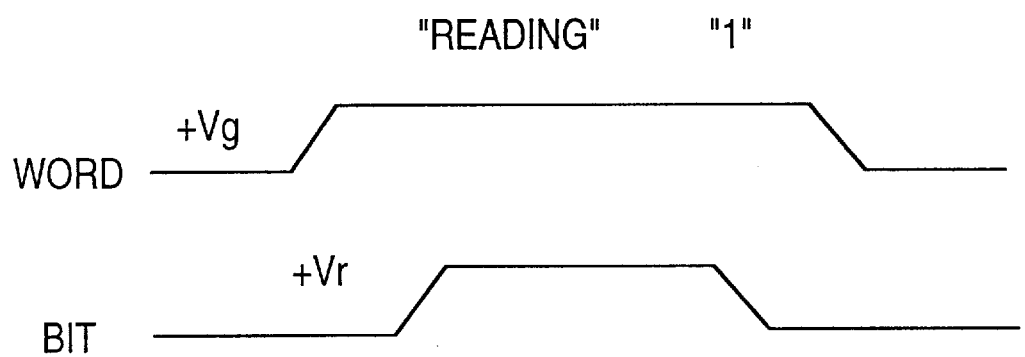

FIG. 10 is a current characteristic curve appearing during reading the ferroelectric memory cell using the leakage current. In a "reading" state, the gate voltage Vg and the voltage Vr, shown in FIGS. 12 and 14, are respectively applied to the word line and the bit line, the FET is turned "on" and a detectable current flows. This is because the bounded charges were charged in the conductive channel by application of a low word line voltage Vw in the "writing" state (see FIG. 11).

Figure 13:
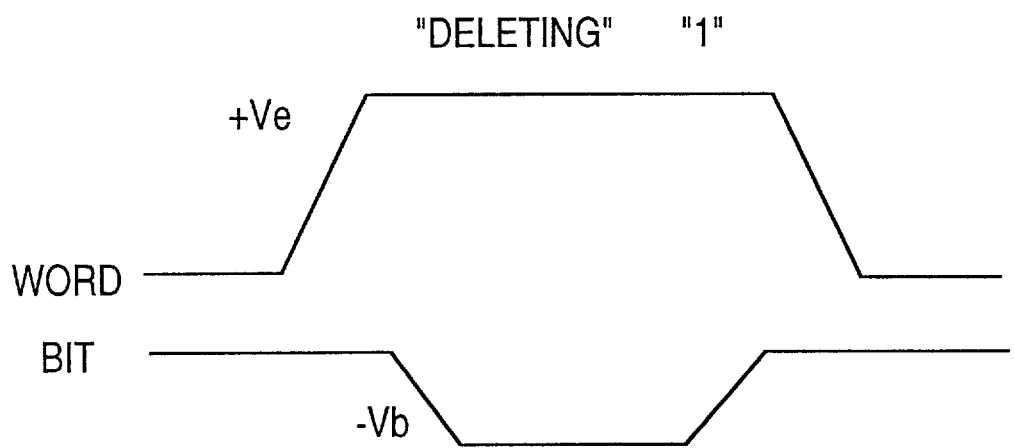
FIGS. 13 and 14 show input signal waveforms during deleting and reading the ferroelectric memory cell shown in FIG. 6.

In the "deleting" state, the bound charges leak out due to the application of the high word line voltage Ve, shown in FIG. 13, and move to the lower electrode 5 of the ferroelectric capacitor, shown in FIG. 9. Therefore, bound charges are not sufficiently charged in the conductive channel of the FET even though the word line voltage Ve is applied. Thus, the FET is turned "off" and an undetectable amount of current flows.

Thus, "Write" "Read", and "Delete" are accomplished by the following:

1. "Write"

Applying a writing voltage on word line (top electrode or gate 7) induces charges in the channel between source (2) and drain (3). Because ferroelectric domains are electric dipoles, they tend to attract charges to maintain charge balance. Therefore, when a voltage is applied from the gate, bound charges are formed at both the top electrode and the channel (see FIG. 8). This process can be carried out in two ways:

a) Voltage is applied between gate (7) and ground. In this case, ever transistor channel under the gate (word line) induces charges.

b) Voltage is applied between gate (7) and drain (3). In this case, when the transistor chip is floated, a specific transistor can be selected randomly.

The charges are balanced with domains of the ferroelectric and remain stable. Thus, these induced charges are equivalent to bound charges. During "writing", the voltage must be of a value lower than that which causes significant leakage current through the dielectric layer (4). This is because those charges are induced in the bottom electrode (5) instead of the channel. When charges are bound in the bottom electrode, the channel cannot hold any more charges because ferroelectric domains are electrically balanced with the bound charges in the bottom electrode.

"Read"

Once charges remain in the channel, the channel shows depletion mode and the transistor can be turned "on" with a gate voltage lower than regular gate voltage for the enhanced mode. As an extreme case, when charges are induced highly in the channel, the transistor can be "on" all the time even when a gate voltage is not applied. Therefore a "write" state can be referred to as an "on" state. This "on" state is assigned as state "O". It can be also referred to as "charging", since charges are induced in the channel by simple voltage application. When the channel is fully induced and it does not need gate voltage to turn on the transistor, the current will flow from drain (bit line) to source (sense amplifier) directly. Thus, a transistor is selected randomly during "reading" using bit line (drain) and sense line (source). When the channel is partially induced, an amount of gate voltage is required to turn on the transistor. However, the gate voltage value will be still lower than the regular gate voltage for the channel with no induced charges.

"Delete"

When the gate voltage is high such that a significant amount of current flows through the dielectric layer (4), charges are induced in the bottom electrode. The current flow mechanism will be one of the following:

1) space charge limited current (SCLC);

2) Frenkel-Poole emission;

3) Schottky emission; or

4) Fowler-Nordein tunneling.

In consideration of both performance and reliability, Frankel-Poole or Schottky emissions are desirable for the dielectric layer. This is because the SCLC level might not be high enough for erasing, and tunneling might cause dielectric breakdown too easily.

When induced charges disappear, the transistor cannot be "on" without the gate voltage application being higher than the "on" state. Thus, the transistor shows an "off" state at normal operation of the above. This "off" state is referred to as state "1" when a binary numeration system is applied. The process where induced charges disappear is called "discharging". Therefore, "1" is a discharged state, in the binary system.

Figure 19A:
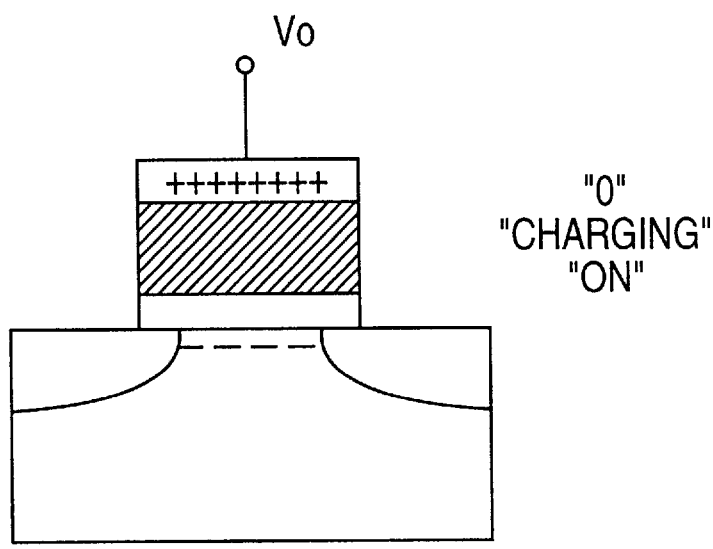

Depending on the leakage current level due to the applied voltage and time, an induced charge amount in the channel is determined. In another words, induced charges in the channel can be controlled by controlling the leakage current through the dielectric layer (4). When induced charges vary in the channel, the current level from the drain source will also vary, which means the transistor current level is different from one channel state to others. Thus, multiple channel states are formed by leakage current levels, and multiple numeration systems can be set up by assigning each channel state as a numeration digit, such as "0", "1", "2", . . . "n", as shown in FIGS. 19(A) through 19(B).

2. "Polarization of the ferroelectrics"

When the channel states are controlled by current leakage through the dielectric layer, no polarization switching occurs. The same polarity of voltages is applied for controlling channel states. Namely, "0" state is formed by applying a low voltage by which capacitive charging occurs, and "1" and higher states are formed by applying higher voltages by which leakage currents flow through dielectric layer (4). The ferroelectric is desired not to show significant current leakage even at such a high voltage in order to maintain a channel. This process is referred to as a "non-switching" process. Therefore, fatigue does not become an issue in this case, and even ferroelectrics with high coercive voltage (or switching voltage) are available. Some candidates are lithium niobate (LiNBOa), bismuth titanate ($Bi_4TiO_{12}$), etc. These materials exhibit high polarization with high coercive voltage. Therefore, they are good candidates for the "non-switching" ferroelectric transistor.

Again, when the substrate 1 of the FET is floated, only the gate voltages Vg can be controlled in a state in which the bit line is grounded.

According to another aspect of the present invention, a multi-numeration system ferroelectric memory using the leakage current is provided. The multi-numeration system ferroelectric memory further includes power for applying the "deleting" voltage of the respective levels for controlling the respective states during deleting in the ferroelectric memory, using the leakage current having the above-mentioned structure. Namely, the multi-numeration is realized using a multiple state formed by changing the induced charges as shown in FIG. 16 by applying a negative pulse voltage shown in FIG. 15 to the bit line. When positive pulses are used for bit line voltage difference between gate and bit line should maintain the value as mentioned above.

Figure 15:
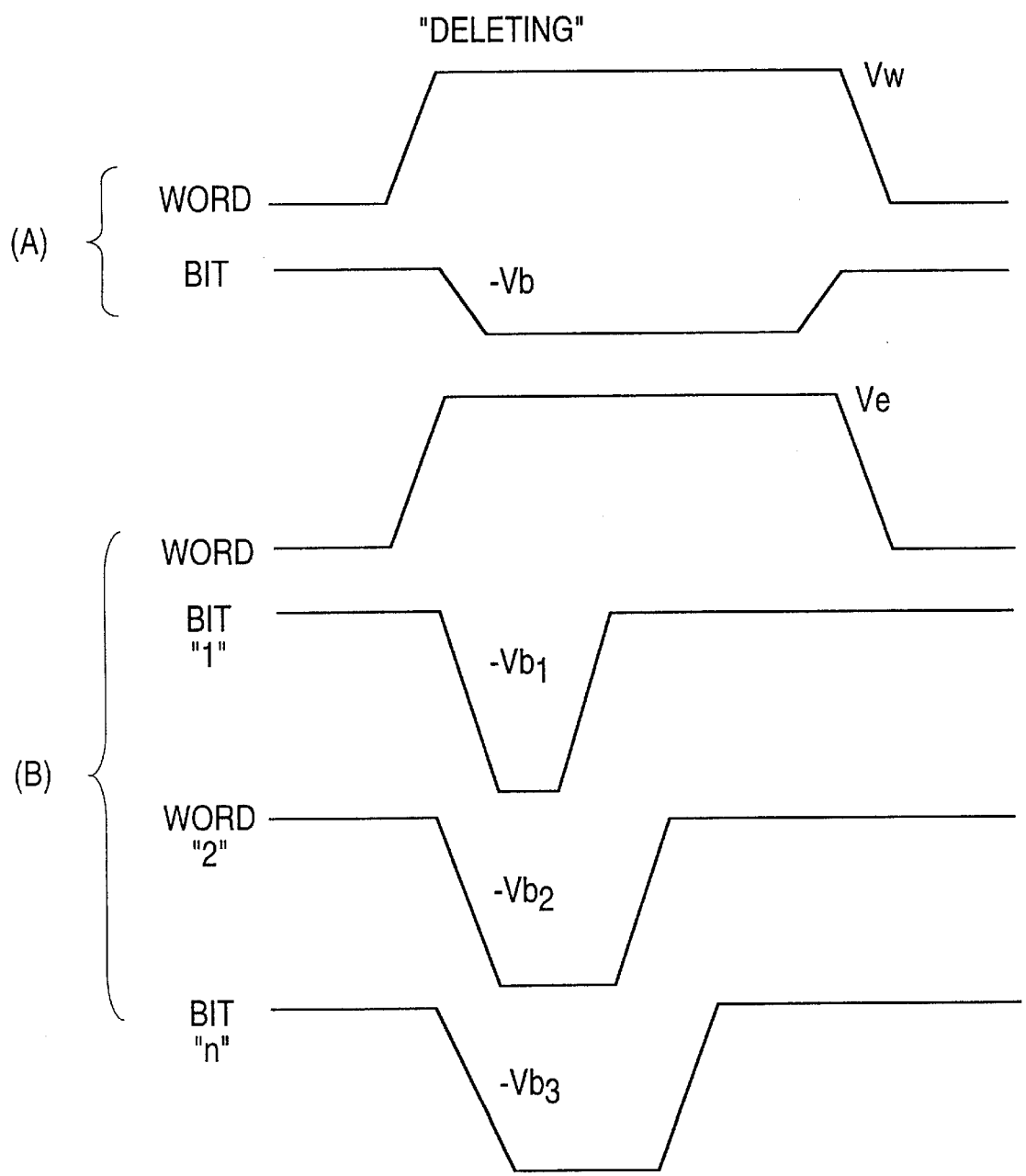
FIG. 15 shows waveforms of a delete signal which is applied to the memory during deleting in order to realize a multi-numeration system ferroelectric memory using a leakage current according to the present invention.
Figure 16:
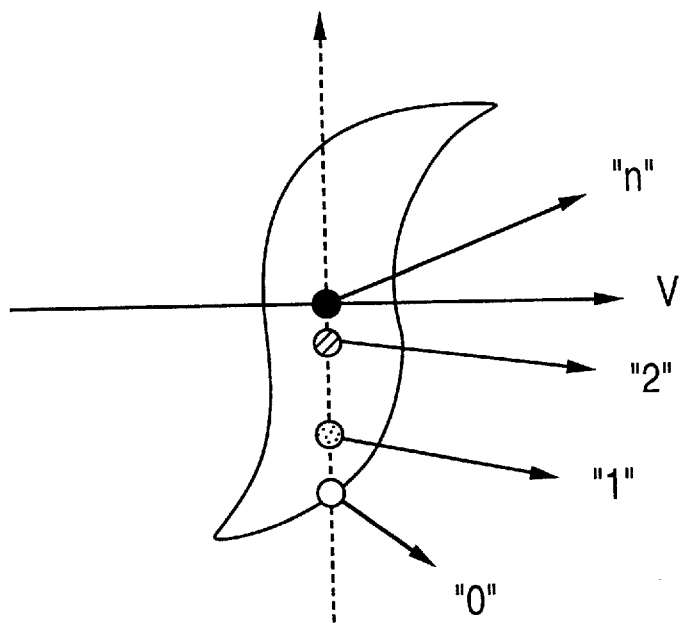
FIG. 16 shows the change amount of induced charges which are induced into a channel of a unit memory cell by the delete signal of FIG. 15.

The voltage waveform corresponding to region (A) of FIG. 15 shows the waveform of the voltage applied to the word line and the bit line in order to realize the "writing" of a "O" state, shown in FIG. 11. The voltage waveform corresponding to region (B) shows various patterns of the "deleting" voltage, shown in FIG. 13, which respectively show the voltage applied to the bit line and voltage applied to the word line according to the states of the respective amounts of the induced charges. The amount of the induced charges can be controlled, as shown in FIG. 16, by a method for applying a negative pulse voltage of different levels during the same time period to the bit line and a method for applying the negative pulse voltage of an identical level to the bit line during different time periods, as shown in FIG. 15. Further, the above two methods can be used interchangeably.

Figure 17:
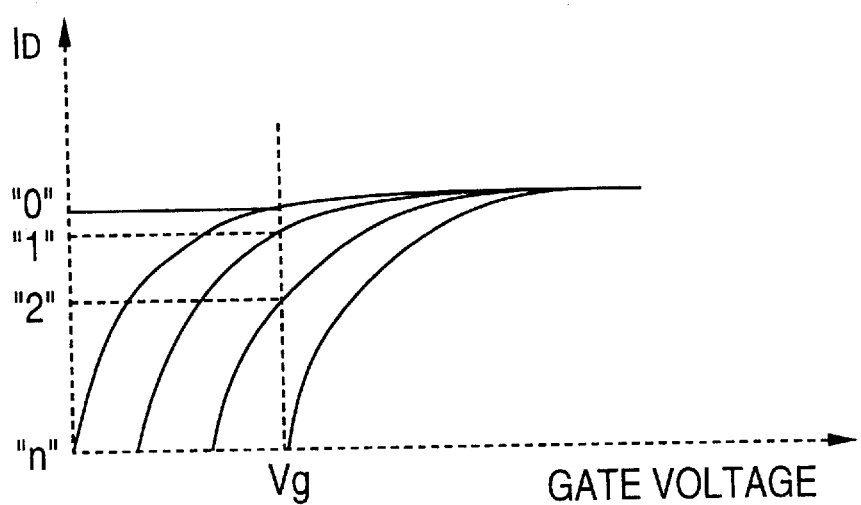
FIG. 17 shows a characteristic curve of a transistor which shows changes in the respective induced charges according to the gate voltage.
Figure 18:
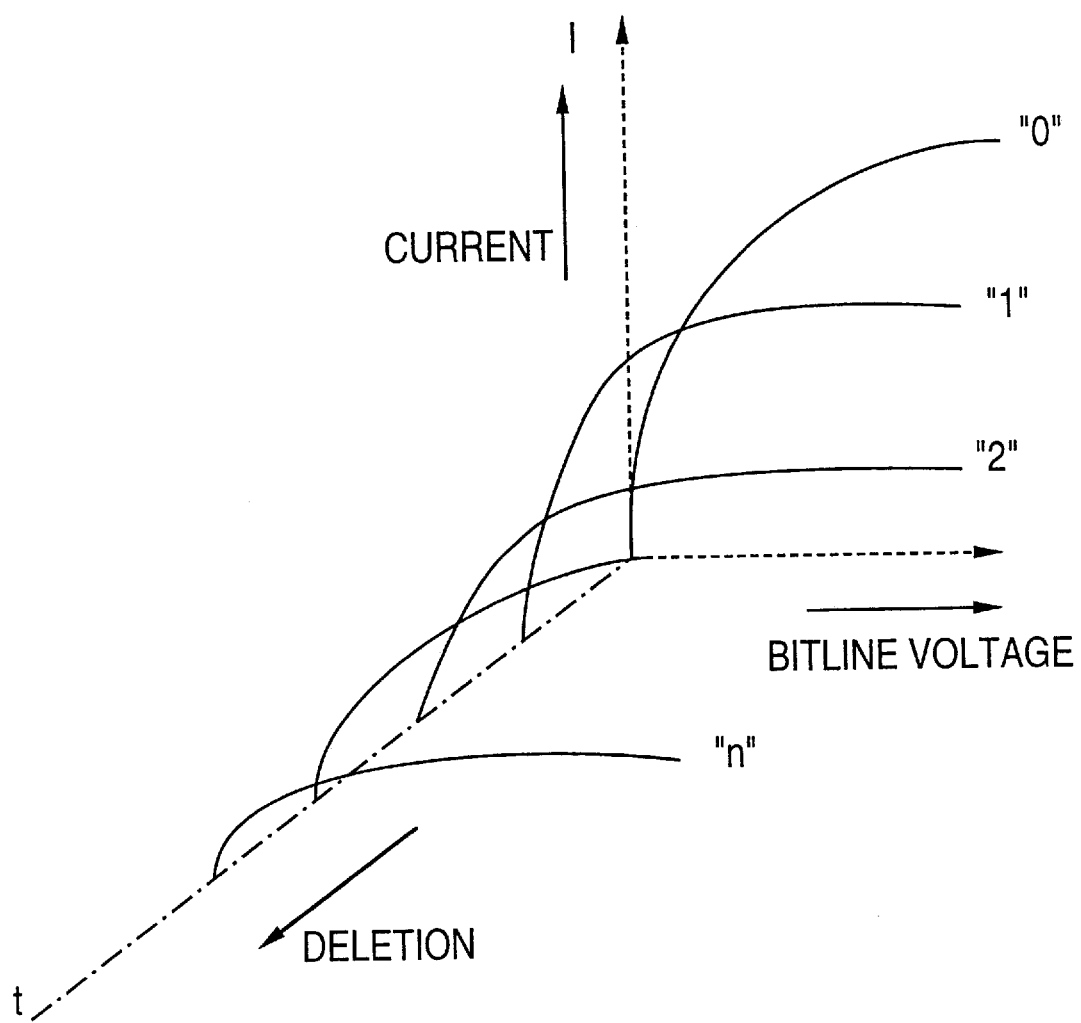
FIG. 18 shows a current characteristic curve of a transistor according to the delete signal of FIG. 15.

FIG. 17 shows the characteristic curve of the drain current $I_D$ according to the gate voltage Vg in the transistor of the unit cells when a method for applying pulse voltages having different levels to the bit line is used. Also, FIG. 18 is a transistor output characteristic curve during "reading" of the unit memory cell according to the "deleting" time. Referring to the above drawings, the outputs (i.e., the induced charges of the transistor channel) are different according to the "deleting" time, even though the gate voltages Vg are identical during reading.

The multi-numeration system ferroelectric memory using the leakage current according to the present invention has a simple structure and can be highly integrated since the discharge depends on the leakage current which passes through the dielectric, thus a separate selection transistor is not required. Also, the operation voltage of the multi-numeration system ferroelectric memory can be lowered compared that of a conventional metal-ferroelectric-metal-insulator-silicon (MFMIS) structure since the "writing" is performed by applying the voltage to the dielectric film so as to have charges corresponding to the amount of the residual polarization without polarization switching and "deleting" is performed by the voltage which is a little higher than the voltage applied to the dielectric film. The operation method of a flash memory (or an EEPROM) is similar to that of the present invention, however, the "deleting" is performed by a tunneling current in the flash memory. A voltage higher than the voltage Vd between the word line and the bit line is required for tunneling and the life-time of the dielectric is generally less than million times since the breakdown of the dielectric is caused by the high voltage. In the present invention, the life-time of the dielectric is extended since a voltage, lower than the voltage used in the tunneling method, can be used. Further, the "writing" time is generally extended in mili-second units in the flash memory since the current density is low and the voltage should be applied for a long time during discharge in the tunneling method. However, it is possible to reduce the "writing" time since a complete discharge is not required in the memory of the present invention. Also, it is possible to obtain a highly integrated memory since the multi-numeration system can be realized by only a power device which can control either the level of the "deleting" voltage, or the "deleting" time of it which is applied to only one gate, without a plurality of gates.

As described above, in ferroelectric memory using the leakage current according to the present invention, the unit cells are formed by transistors and dielectrics, and dielectrics or ferroelectrics are used as a gate insulating material. The ferroelectric capacitor is deposited on the upper portion of the gate insulating material, and the upper electrode of the ferroelectric capacitor is used as the gate. Also, the leakage current of the ferroelectric has a negligible value in a uniform voltage Vd and a material, in which the Schottky emission or the Frankel-Poole emission is large, is selected as the dielectric which is used as the gate insulating material.

According to the present invention, the "writing" is performed by applying a uniform voltage between the gate and the bit line thereby inducing the charges between the drain and the source. The information of the multi-numeration system can be stored by applying the voltages of various levels having an identical pulse widths higher than the above, or the "deleting" voltages of various pulse widths having an identical level between the gate and the bit line, making the leakage current (having various current densities) flow through the gate insulating material, and creating the induced charges between the drain and the source.

The Korean application, No. 96-14707, filed on May 6, 1996, is incorporated by reference herein.

What is claimed is:

1. A ferroelectric memory, comprising:
   (a) a plurality of unit cells each having:
      (i) a conductive substrate,
      (ii) a source and a drain each doped with impurities leaving a conductive channel of a uniform width between said source and said drain on said substrate,
      (iii) a dielectric layer deposited so as to cover the conductive channel and an edge of both said source and said drain,
      (iv) a lower electrode deposited on said dielectric layer,
      (v) a ferroelectric layer deposited on said lower electrode, and
      (vi) an upper electrode deposited on said ferroelectric layer,
      (vii) wherein a dielectric leakage current of said dielectric layer and a ferroelectric leakage current of said ferroelectric layer have negligible values at less than a predetermined voltage, and wherein the ferroelectric leakage current is negligible and the dielectric leakage current is more than a predetermined value at more than said predetermined voltage.

2. A ferroelectric memory as claimed in claim 1, wherein said dielectric layer comprises a dielectric layer or a ferroelectric layer.

3. A ferroelectric memory as claimed in claim 1, wherein said dielectric layer comprises a dielectric material in which the dielectric leakage current is generated by a Schottky emission or a Frankel-Poole emission or Fowler-Nordein tunneling.

4. A ferroelectric memory as claimed in claim 1, wherein said dielectric layer further comprises a buffer layer having a dielectric leakage current value.

5. A multi-numeration system ferroelectric memory, comprising:
(a) plurality of unit cells each having:
  (i) a conductive substrate,
  (ii) a source and a drain each doped with impurities leaving a conductive channel of a uniform width between said source and said drain on said substrate;
  (iii) a dielectric layer deposited so as to cover the conductive channel and an edge of both said source and said drain;
  (iv) a lower electrode deposited on said dielectric layer,
  (v) a ferroelectric layer deposited on said lower electrode,
  (vi) an upper electrode deposited on said ferroelectric layer; and
(b) a power source for applying a predetermined total voltage to said upper electrode, wherein said predetermined total voltage comprises n different deleting voltage levels, wherein the n different deleting voltage levels cause (i) n different dielectric leakage currents classifiable from each other in said dielectric layer, and (ii) a ferroelectric leakage current in said ferroelectric layer, said ferroelectric leakage current being negligible.

6. A multi-numeration system ferroelectric memory as claimed in claim 5, wherein said n different deleting voltages levels have identical levels and different applying periods.

7. A multi-numeration system ferroelectric memory as claimed in claim 5, wherein said n different deleting voltage levels are obtained by combining voltages having different levels and identical applying periods, with voltages having an identical levels and different applying periods.

8. A multi-numeration system ferroelectric memory as claimed in claim 5, wherein said conductive substrate is floated.

9. A multi-numeration system ferroelectric memory as claimed in claim 5, wherein said dielectric layer comprises a dielectric or a ferroelectric layer.

10. A multi-numeration system ferroelectric memory as claimed in claim 5, wherein said dielectric layer is formed of a dielectric material, wherein said dielectric material has at least one of the n different dielectric leakage currents generated by one of a Schottky emission, or a Frankel-Poole emission, or Fowler-Nordein tunneling.

11. A multi-numeration system ferroelectric memory as claimed in claim 5, wherein said dielectric further comprises a buffer layer having a dielectric leakage current value.

* * * * *